United States Patent [19]
Flora

[11] Patent Number: 5,635,857
[45] Date of Patent: Jun. 3, 1997

[54] IC CHIP USING A COMMON MULTIPLEXOR LOGIC ELEMENT FOR PERFORMING LOGIC OPERATIONS

[75] Inventor: Laurence P. Flora, Valley Center, Calif.

[73] Assignee: Unisys Corporation, Blue Bell, Pa.

[21] Appl. No.: 351,909

[22] Filed: Dec. 8, 1994

[51] Int. Cl.$^6$ .................... H03K 19/173; H03K 19/096
[52] U.S. Cl. .................. 326/39; 326/93; 327/407
[58] Field of Search ............ 327/407; 326/37–39, 326/93

[56] References Cited

U.S. PATENT DOCUMENTS

| | | | |
|---|---|---|---|
| 4,409,683 | 10/1983 | Woodward | 327/407 |
| 4,541,067 | 9/1985 | Whitaker | 364/716 |
| 4,825,105 | 4/1989 | Hozle | 327/407 |
| 5,198,705 | 3/1993 | Galbraith | 327/407 |
| 5,243,599 | 9/1993 | Barrett | 327/407 |
| 5,280,202 | 1/1994 | Chan | 327/407 |
| 5,436,574 | 7/1995 | Veenstra | 327/407 |

*Primary Examiner*—Edward P. Westin
*Assistant Examiner*—Benjamin D. Driscoll
*Attorney, Agent, or Firm*—Nathan Cass; Mark T. Starr

[57] ABSTRACT

An IC chip employs a common multiplexor logic element in different logic configurations for performing a variety of different logic functions, whereby path delays can be accurately matched. In addition, a phase-locked-loop is employed for providing accurately timed signals having different durations and differently occurring timing edges.

8 Claims, 10 Drawing Sheets

IC CHIP USING A COMMON MULTIPLEXOR LOGIC ELEMENT FOR PERFORMING LOGIC OPERATIONS

BACKGROUND OF THE INVENTION

The present invention generally relates to improved means and methods for performing logic operation on an IC chip.

As is well known, it is often necessary to create signals on an IC chip having different edge placements and signal widths. Two significant problems are presented in creating such signals.

A first problem arises as a result of the difficulty of providing relatively large on-chip delays. This difficulty occurs because on-chip delays are severely affected by unpredictable processing variations as well as by voltage and temperature, which can cause the resulting delay provided to vary by as much as ±60%. Thus, when a large delay is required to be provided on an IC chip, this ±60% variation will be significant and may not be tolerable, particularly where critical timing delays are involved. A typical known solution is to provide this required long delay circuitry off-chip where accuracy can be more precisely controlled. However, this has the severe disadvantage of requiring more parts, more board space, and more expense.

Figure 1:
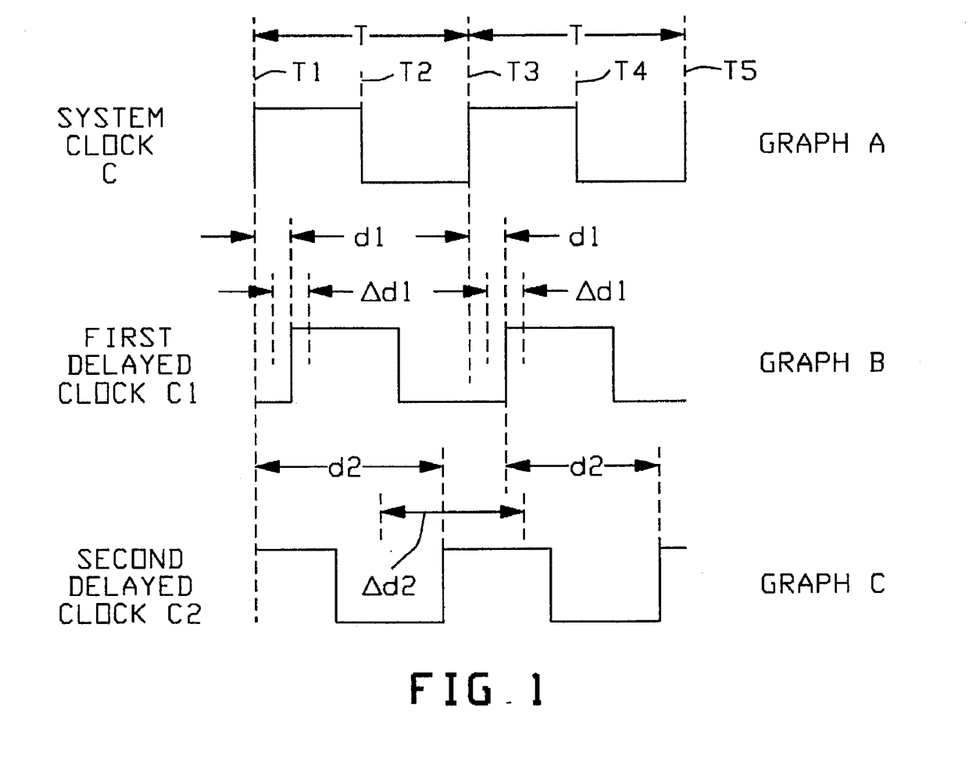
FIG. 1 is a series of graphs illustrating problems that can occur using known on-chip delays for creating IC chip signals having different edge placements.

An example of the problem associated with providing a relatively long on-chip delay on an IC chip is illustrated by the graphs in FIG. 1.

Graph A in FIG. 1 illustrates a typical clock C having a clock cycle time T with rising clock edges loccurring at times T1 and T3, and falling clock edges occurring at times T2 and T4.

Graph B in FIG. 1 illustrates a FIRST DELAYED SIGNAL S1 produced by delaying clock C by an on-chip delay d1 which provides a relatively small delay (e.g., d1=0.10T). It is assumed in Graph B that d1 varies by about ±40% of d1, as indicated by Δd1.

Graph C in FIG. 1 illustrates a SECOND DELAYED SIGNAL S2 produced by delaying clock C by an on-chip delay d2 which provides a relatively large delay (e.g., d2=9T/10). Similar to d1 in Graph B, it is assumed in Graph C that d2 varies by about ±40% of d2, as indicated by Δd2.

As shown by Graph B in FIG. 1, the effect of Δd1 on the timing edges provided by S1 is relatively small and can easily be tolerated. This will be evident by noting that, for d1=0.10T, Δd1 will only amount to about 0.08T.

However, as shown by Graph C in FIG. 1, the effect of Δd2 on the timing edges of S2 is intolerable, since it can cause the rising edge of S2 to occur in the next clock cycle (after T3). This will be evident by noting that, for d2=0.09T, Δd2 will amount to about 0.72T. This will cause the rising clock edge of S2 to occur at about 1.26T (0.09T+0.36T), which is greater than the clock cycle time T. Note that this occurred assuming that Δd2 varies by only ±40%. Since this variation may typically be ±60% in the worst case, the provision of other than relatively small delays on a chip can present a serious timing problem. This is a primary reason why the prior art normally provides relatively long delays (such as those greater than T/2) off-chip where delay variations can be better controlled.

Another problem which arises in creating IC chip signals having different edge placements occurs because different logic functions are required to produce signals having different pulse widths. Since logic elements used to perform these different logic functions typically introduce different propagation delays, critical timing requirements may be compromised. For example, since a conventional OR gate may typically provide a different propagation delay from a conventional AND gate, different logical combinations of these OR and AND gates can produce significantly different path delays.

SUMMARY OF INVENTION

A broad object of the present invention is to provide improved methods and apparatus for creating IC chip signals having differing edge placements.

An additional object of the present invention is to provide improved methods and apparatus for creating a relatively large on-chip delay on an IC chip.

Another object of the present invention is to provide an IC chip having a common logic element for performing a wide variety of different logic functions.

A further object of the present invention is to provide the aforementioned methods and apparatus in an efficient and economical manner.

In a preferred embodiment of the present invention directed to accomplishing the above objects, a significant technical advance is obtained by advantageously creating "negative" on-chip delays which can be used as a substitute when large delays are required, whereby delay variations are maintained within tolerable limits, even for relatively large delays. In addition, in embodiments requiring the performance of logic operations, multiplexors are configured for use as a common logic element capable of performing a wide variety of different logic functions, whereby critical delays may be more accurately controlled.

The specific nature of the invention as well as other objects, advantages and uses thereof will become evident from the following description of various preferred embodiments of the invention in conjunction with the accompanying drawings.

DESCRIPTION OF PREFERRED EMBODIMENTS

Like numerals and characters represent like elements throughout the figures of the drawings.

Figure 2:
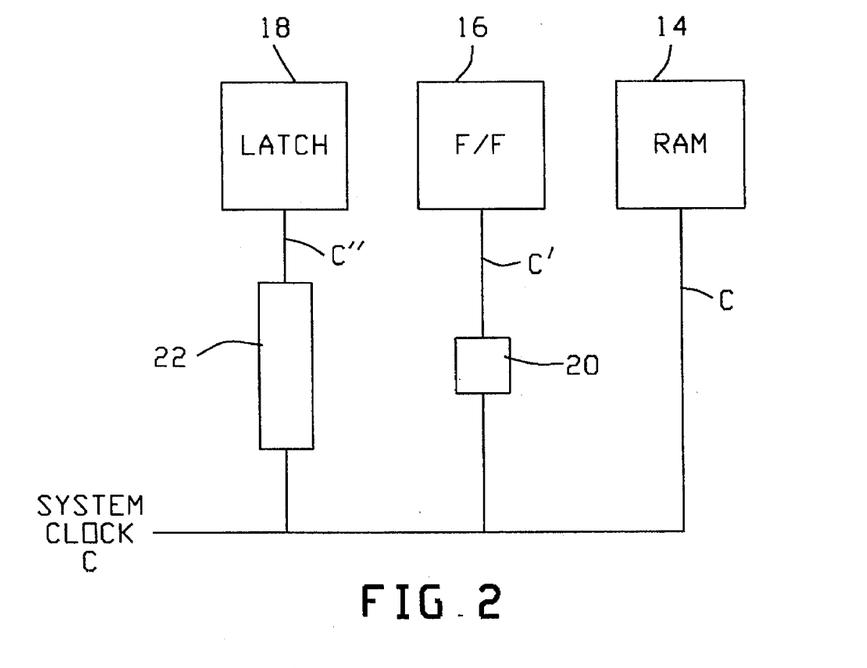
FIG. 2 is a block diagram illustrating how delays are conventionally provided on an IC chip.

Referring to FIG. 2, shown therein is a block diagram illustrating how delays are typically provided on an IC chip, such as a VLSI chip. As indicated in FIG. 2, the chip includes a RAM (random access memory) 14, a flip-flop 16 and a latch 18. Of course, other circuitry is also provided on the chip, but is not shown since it is not pertinent to the present invention.

It will be assumed that RAM 14 in FIG. 2 requires the normal system clock C, that flip-flop 16 requires a clock C' having a rising edge which occurs a relatively short time d' after the rising edge of system clock C, and that latch 18 requires a clock C" having a rising edge which occurs a relatively long time d" after the rising edge of system clock C. The delay d' required for clock C' may typically be provided by an on-chip delay 20, and the delay d" required for clock C" may typically be provided by an on-chip delay 22. Graphs A, B and C in FIG. 3 respectively illustrate system clock C, flip-flop clock C' and latch clock C" provided by FIG. 2, and the delays d' and d" provided for C' and C", respectively.

Since the delay d' of delay 20 in FIG. 2 is relatively short, its worst case variations can be tolerated, as previously explained with respect to the first delayed clock C1 in FIG. 1. However, since delay d" of delay 22 is relatively long, its worst case variations could create the problem illustrated for the SECOND DELAYED CLOCK C2 in Graph C of FIG. 1, which illustrates how this worst case delay can cause the rising edge of the delayed clock to occur in the wrong clock cycle. One way of preventing this problem from occurring is to test delay 22 on each chip to make sure that its actual worst-case delay variation is within acceptable limits. This added testing is undesirable since it can significantly increase the manufacturing cost. Another way of solving this problem is to provide this relatively long delay 22 off-chip, which is also undesirable, as pointed out previously.

Figure 4:
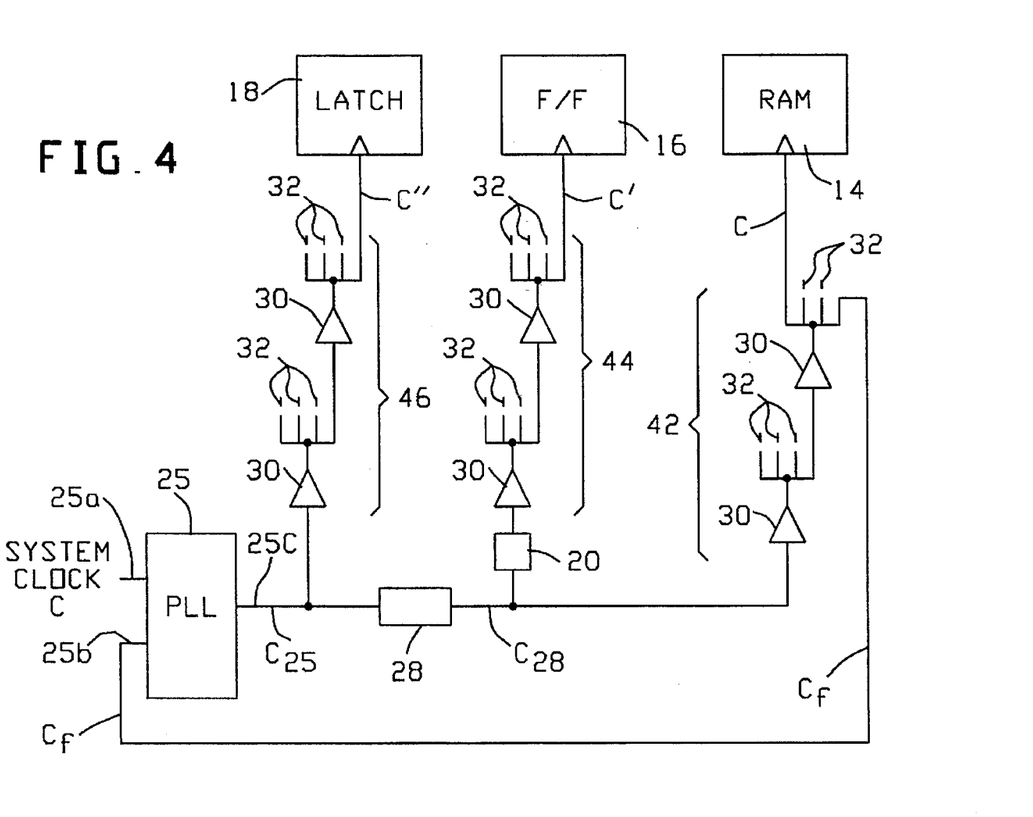
FIG. 4 is a block diagram illustrating a preferred embodiment of the present invention for creating a relatively long delay on an IC chip.

FIG. 4 illustrates a preferred embodiment of the invention which provides a unique solution to the above described problem of providing an on-chip long delay by creating an on-chip "negative" delay on the chip which can be used instead of a required long delay when its worst case variations could cause a problem.

Figure 3:
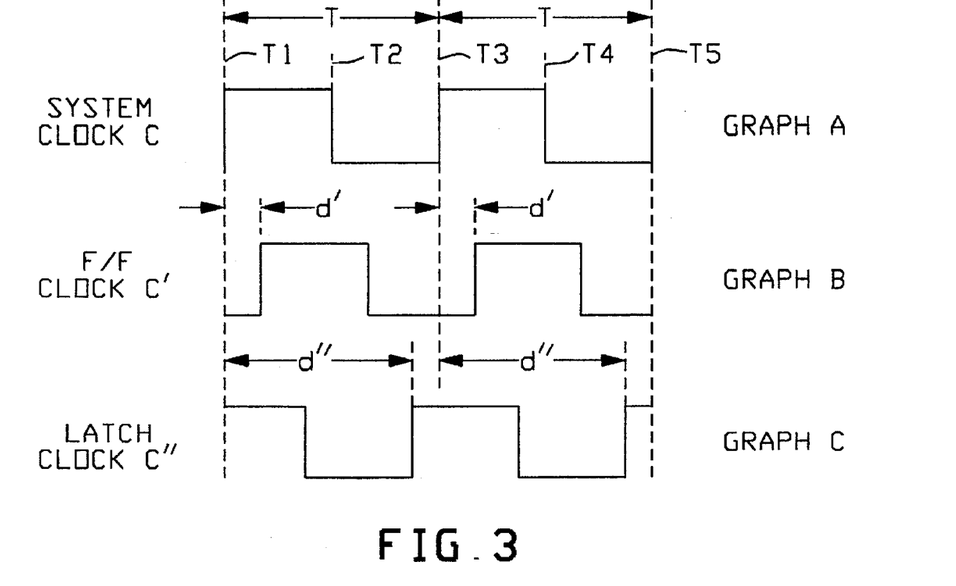
FIG. 3 is a series of graphs illustrating the delays produced by FIG. 2.

With reference to FIG. 4, illustrated therein is the same RAM 14, flip-flop 16 and latch 18 shown in FIG. 2. However, an important difference is the manner in which the long delay d" illustrated in Graph C of FIG. 3 is provided for latch 18.

As shown in FIG. 4, the system clock C is applied to a phase-locked-loop (PLL) 25, which may be of conventional form. PLL has inputs 25a and 25b and an output 25c. The system clock C is applied to input 25a and a feedback clock signal $C_f$ is applied to input 25b. As is well known, a PLL exhibits the characteristic of automatically adjusting its phase so that signals applied to its inputs 25a and 25b are synchronized. Accordingly, PLL 25 will operate to synchronize the feedback clock signal $C_f$ with the system clock C. This feedback clock signal $C_f$ as well as system clock C may thus be used where a normal system clock C is required, such as for application to RAM 14.

Still with reference to FIG. 4, output 25c of PLL 25 is applied to a delay 28 whose output passes through clock buffer path 42 to become the clock $C_f$ applied to RAM 14. As is conventional, this clock buffer path 42 includes inverters 30 which are used to permit the signal applied thereto to drive a plurality of other lines, such as generally indicated by lines 32. For simplicity of illustration, those lines 32 which are directed to other chip circuitry not pertinent to the present invention are shown terminated with dashes. As explained previously, PLL 25 causes $C_f$ to be synchronized with the system clock C, thereby meeting the requirement that RAM 14 receive the system clock C.

So far, it has been described how a clock $C_f$ synchronized with the system clock C is provided for RAM 14 by the synchronizing operation provided by PLL 25. It will next be described how clocks C' and C" are provided by FIG. 4 for flip flop 16 and latch 18, respectively.

As shown in FIG. 4, clock C' is provided for flip flop 16 by passing the output of delay 28 to flip flop 16 via delay 20 and a clock buffer path 44 including inverters 30. Clock buffer path 44 is chosen to provide the same delay as path 42. As a result, clock C' will be delayed from clock $C_f$ (system clock C) by the delay provided by delay 20, since other delays (paths 42 and 44) are the same. The relatively small delay d' required by flip flop 16 is thus provided by choosing delay 20 equal to d'. Since d' is relatively small, it can be provided on-chip since its worst case variations will be tolerable, as explained previously.

Next to be described is the manner in which the preferred embodiment of FIG. 4 provides for on-chip implementation of the relatively long delay d" required between clock C" applied to latch 16 and clock $C_f$ (system clock C) applied to RAM 14, despite worst case delay variations which would ordinarily make such an on-chip implementation intolerable.

As shown in FIG. 4, clock C" applied to latch 18 is obtained from PLL output 25c via clock buffer path 46. This clock buffer path 46, like path 44, is chosen to be equal to clock buffer path 42 located between the output of delay 28 and RAM 14. Clock $C_f$ (the system clock C) will thus be delayed from C" by the amount of delay 28, since other delays (path 42 and 46) are the same. This permits the required relatively long delay d" for clock C" to be provided by choosing delay 28 equal to $d_n$=T−d", where T equals the clock period. For example, for a required relatively long delay d"=0.90T, delay 28 need merely provide the relatively small on-chip delay $d_n$=T−0.90T/10=0.10T, which would be tolerable even in view of worst case variations.

Figure 5:
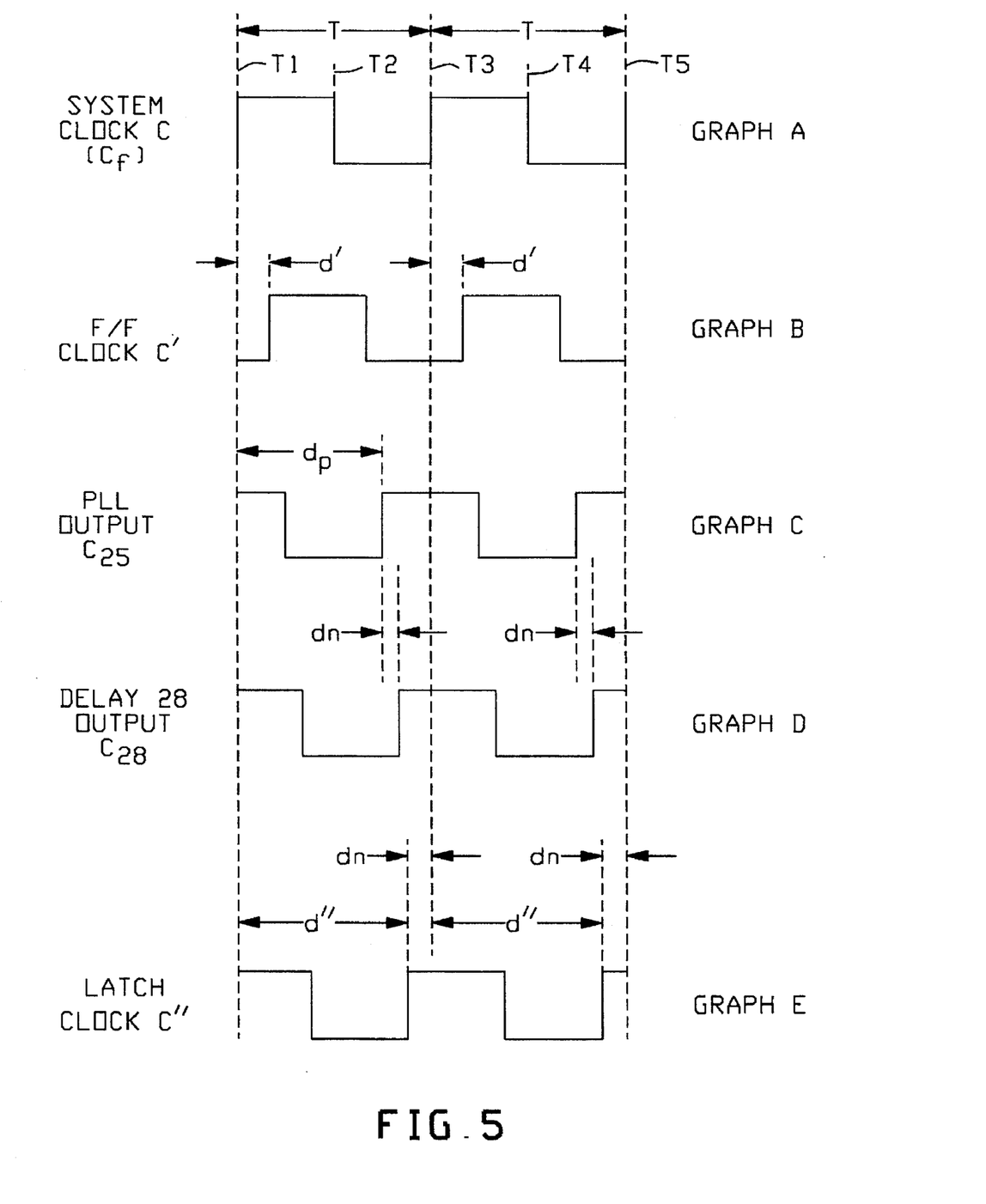
FIG. 5 is a series of graphs illustrating the operation of FIG. 4.

The operation of FIG. 4 is illustrated by the graphs of FIG. 5. Graph A in FIG. 5 illustrates the system clock C which is applied to input 25a of PLL 25. Graph A also illustrates feedback clock $C_f$ which is applied to PLL input 25b, since PLL 25 synchronizes $C_f$ with C. The requirement that the system clock C be applied to RAM 14 is thus met.

Graph B in FIG. 5 illustrates clock C' applied to flip-flop 16 which will be seen to be delayed by delay d' from the system clock C as a result of being applied thereto via delay 20 and clock buffer path 44. As mentioned previously, since the required delay d' is relatively small, its provision on-chip is tolerable.

Graph C in FIG. 5 illustrates clock signal $C_{25}$ appearing on PLL output 25c. Graph D in FIG. 5 illustrates the clock $C_{28}$ obtained after $C_{25}$ is delayed by delay 28. Note in Graphs C and D that, as is to be expected, $C_{28}$ is delayed from $C_{25}$ by $d_n$, the delay provided by delay 28. With respect to the delay $d_p$ shown between clock $C_{25}$ and the system clock C in Graphs A and B in FIG. 5, it will be understood that delay $d_p$ represents the delay required to be provided by PLL 25 in order to produce synchronism between C and $C_f$, as explained previously.

Graph E in FIG. 5 illustrates the resulting clock signal C" appearing at latch 16 in FIG. 4. It will be remembered that latch 16 requires the relatively long delay d" with respect to the system clock C (Graph C in FIG. 3). It will be understood from Graph E of FIG. 5 that this delay d" is obtained for clock C" as a result of the embodiment of FIG. 4 having provided the negative delay $d_n$ for C" with respect to the system clock C, which is equivalent to having provided the relatively long delay d" using delay 22 in FIG. 2.

The previous description has illustrated how a clock having a long delay as well as a short delay relative to a system clock can advantageously be provided on an IC chip. It will next be explained with reference to FIGS. 6–9 how the present invention can also be advantageously employed for creating other types of IC chip signals.

Figure 6:
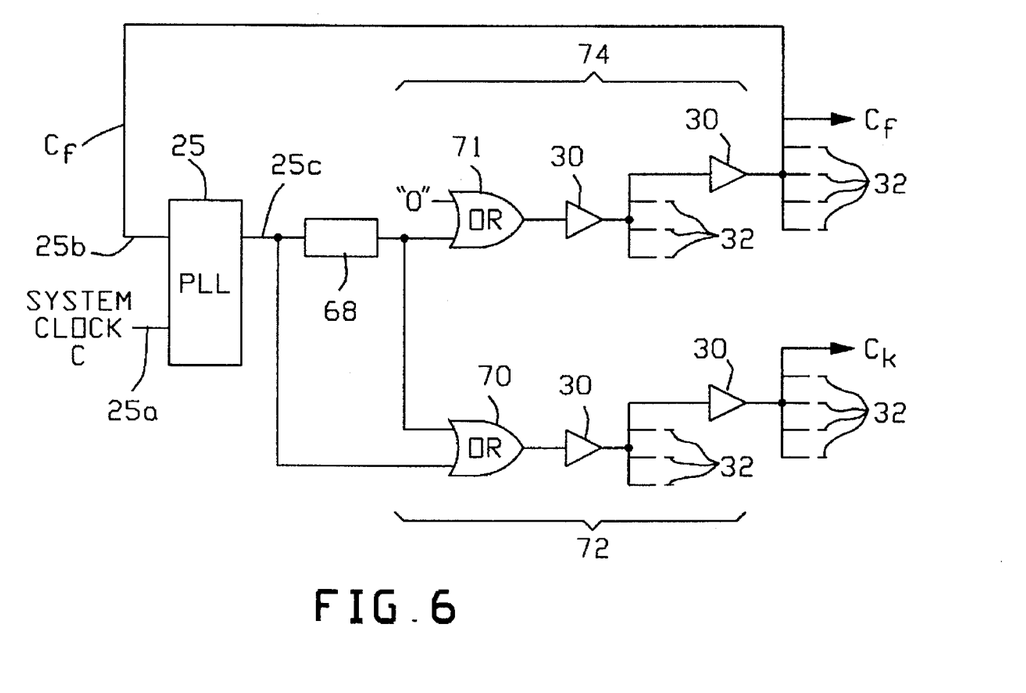
FIG. 6 is a block diagram illustrating a preferred embodiment of the present invention for creating a clock signal having an early rising edge.

In FIG. 6, similarly to FIG. 4, PLL inputs 25a and 25b receive the system clock C and a feedback clock $C_f$, respectively. Also, similarly to FIG. 4, PLL output 25c is applied to a delay, which in FIG. 6 is designated as delay 68 providing a delay $d_k$. As shown in FIG. 6, PLL output 25c is applied to an OR gate 70 along with the output of delay 68. As was the case for paths 42, 44 and 46 in FIG. 4, paths 72 and 74 are designed to provide the same delay. Since path 72 includes OR gate 70, an OR gate 71 is provided in path 74 to obtain better matching of the two paths, the unused input of OR gate 71 being connected to a logic "0". As will be seen from the graphs of FIG. 7, FIG. 6 produces a clock $C_k$ having a rising edge which occurs $d_k$ earlier than the rising edge of the system clock C, and a falling edge which is coincident with the falling edge of C.

Figure 8:
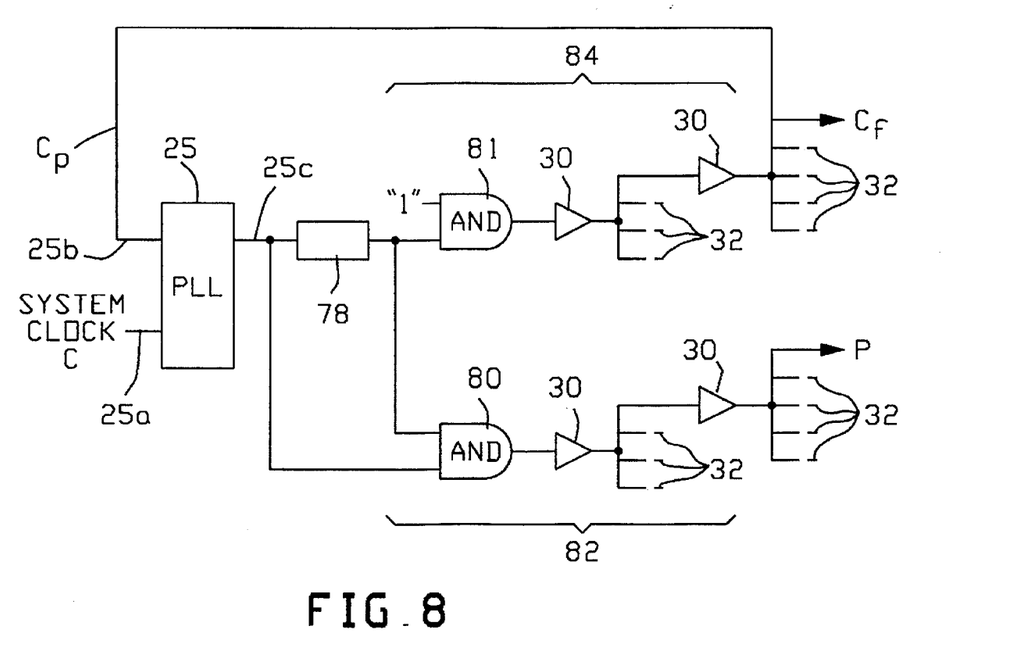
FIG. 8 is a block diagram illustrating a preferred embodiment of the present invention for creating an early pulse.

In FIG. 8 PLL 25 inputs 25a and 25b likewise receive the system clock C and a feedback clock $C_f$, respectively, and PLL output 25 is likewise applied to a delay, which in FIG. 8 is designated as delay 78 providing a delay $d_p$. As shown in FIG. 8, PLL output 25c is applied to one input of an AND gate 80, while the other input of AND gate 80 receives the output of delay 78. Also, like paths 72 and 74 in FIG. 6, paths 82 and 84 are designed to provide the same delay. Since path 82 includes an AND gate 80, an AND gate 81 is provided in path 84 in order to obtain better matching of the two paths, the unused input of AND gate 81 being connected to a logic "1". As will be seen from the graphs of FIG. 9, FIG. 8 produces a pulse P having a rising edge which occurs $d_p$ earlier than the rising edge of system clock C, and a falling edge which is coincident with the rising edge of C.

Figure 10:
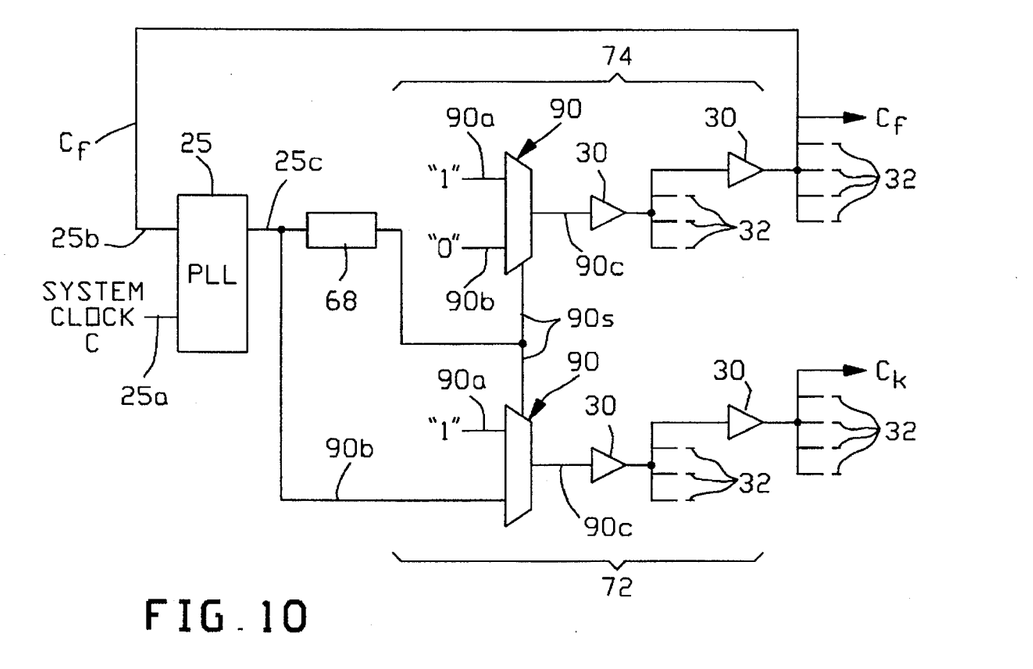
FIG. 10 is an alternate embodiment of FIG. 6.
Figure 11:
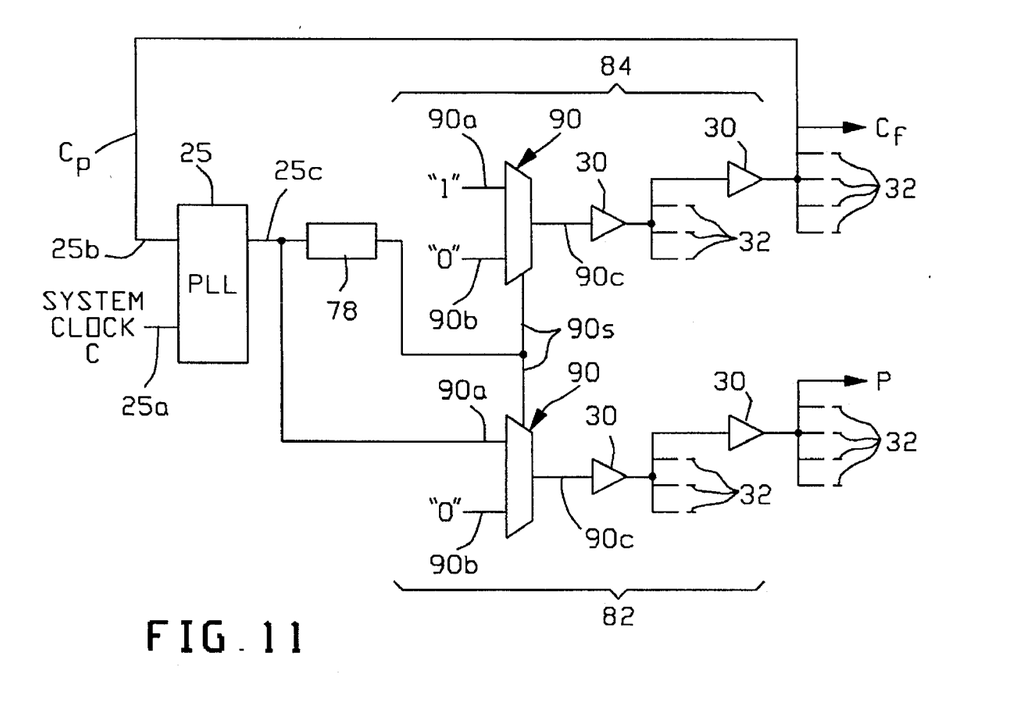
FIG. 11 is an alternate embodiment of FIG. 8.

FIGS. 10 and 11 illustrate alternate embodiments of FIG. 6 and 8, respectively, which employ appropriately configured multiplexors 90 in place of the OR gates 70 and 71 in FIG. 6, and AND gates 80 and 81 in FIG. 8.

Each multiplexor 90 in FIGS. 10 and 11 has a multiplexor selection input 90s, two other multiplexor inputs 90a and 90b, and a multiplexor output 90c. Each multiplexor 90 operates such that, when mulitplexor selection input 90s is "1" (or true), the top multiplexor input 90a is selected as the multiplexor output 90c. On the other hand, when multiplexor selection input 90s is (or false), the bottom multiplexor input 90b is selected as the multiplexor output 90c.

Figure 7:
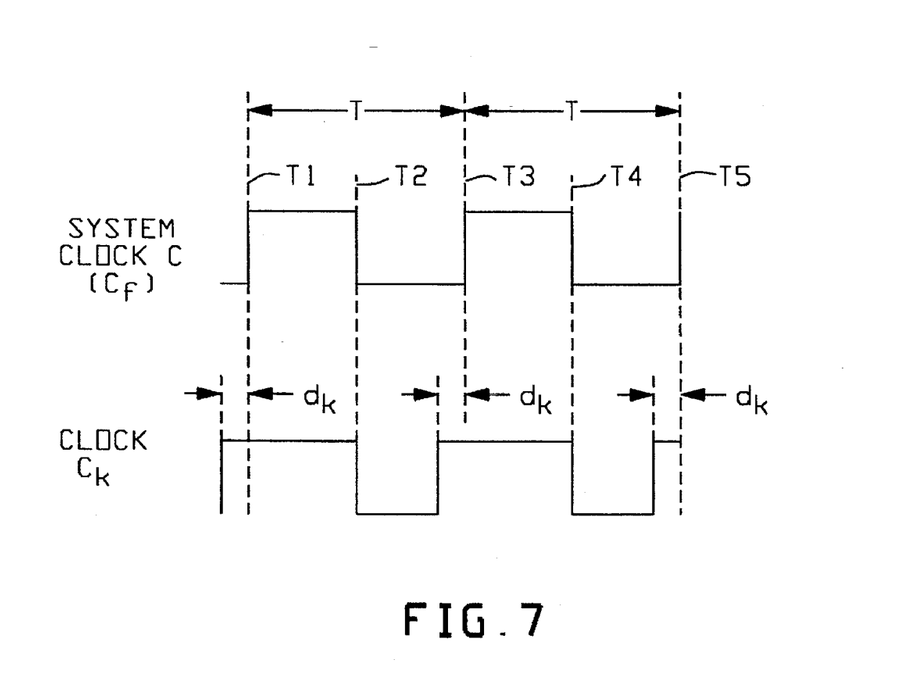
FIG. 7 is a series of graphs illustrating the operation of FIG. 6.

In FIG. 10 (which is an alternate embodiment of FIG. 6), it will be seen that a multiplexor 90 is substituted for OR gate 70 in path 72 of FIG. 6, and another multiplexor 90 is substituted for OR gate 71 in path 74. As shown in FIG. 10, the output of delay 68 is coupled to the selection input 90s of both multiplexors 90. Also, multiplexor input 90b in path 72 receives PLL output 25c, while multiplexor input 90a in path 72 receives a logic "1". In path 74, multiplexor inputs 90a and 90b receive a logic "1" and "0", respectfully. From the above described operation of multiplexor 90, it will be understood that the illustrated configurations of multiplexors 90 provided in paths 72 and 74 in FIG. 10 produces the same resulting output signals as shown in FIG. 7.

Figure 9:
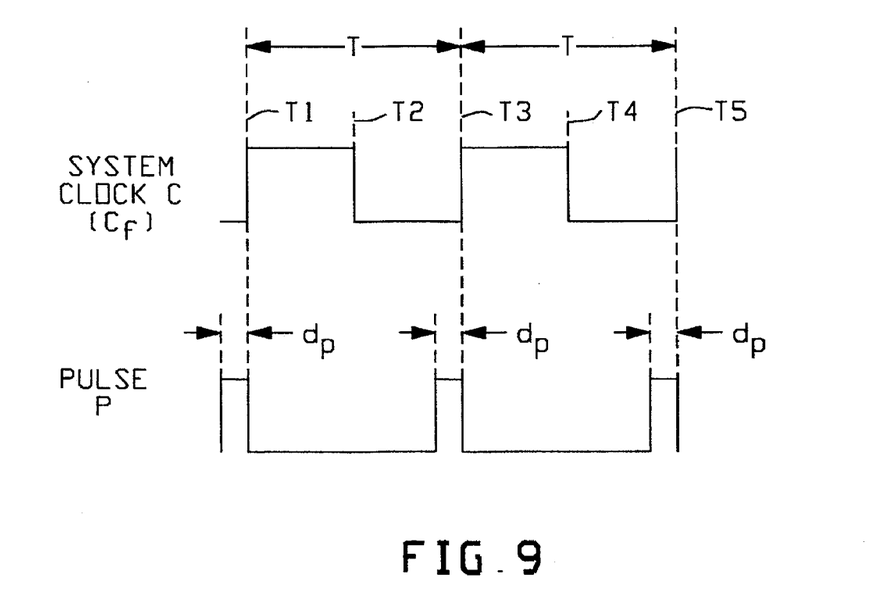
FIG. 9 is a series of graphs illustrating the operation of FIG. 8.

In FIG. 11 (which is an alternate embodiment of FIG. 7), it will be seen that a multiplexor 90 is substituted for AND gate 80 in path 82 of FIG. 8 and another multiplexor 90 is substituted for AND gate 81 in path 84. As shown in FIG. 11, the output of delay 78 is coupled to the selection input 90s of both multiplexors 90. Also, multiplexor input 90b in path 82 receives PLL output 25c, while multiplexor input 90a in path 72 receives a logic "0". In path 84, multiplexor inputs 90a and 90b receive a logic "1" and "0", respectfully. From the above described operation of multiplexor 90, it will be understood that the illustrated configurations of multiplexors 90 provided in paths 82 and 84 in FIG. 11 produces the same resulting output signals as shown in FIG. 9.

Figure 12:
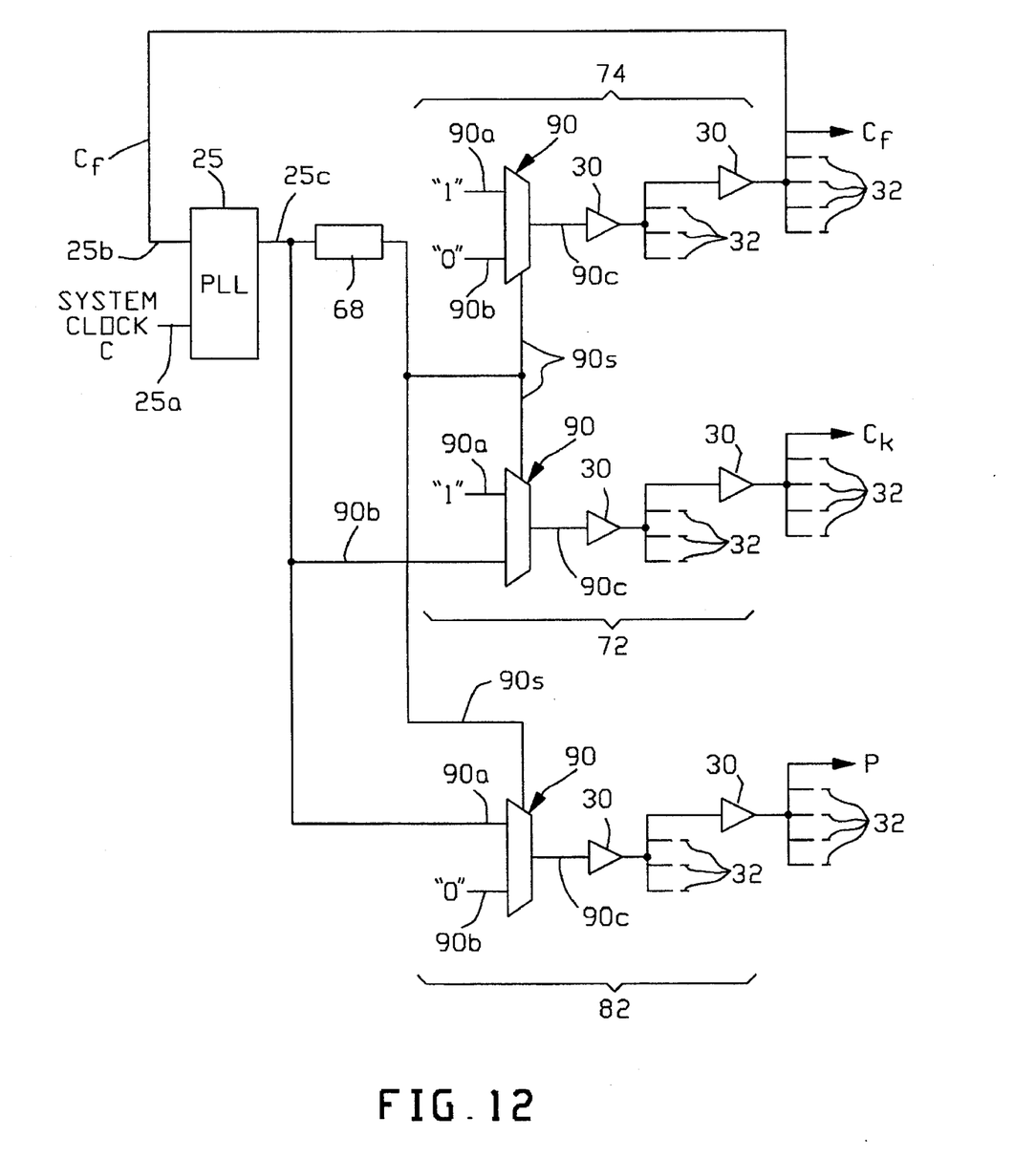
FIG. 12 is an embodiment incorporating the embodiments of FIGS. 10 and 11.

A significant advantage of the alternate embodiments of FIGS. 10 and 11 is that the use of multiplexors 90 therein (instead of OR and AND gates as in FIGS. 6 and 8) facilitates the combination of FIGS. 10 and 11 into the single embodiment shown in FIG. 12, which uses a single PLL 25 and wherein $d_k=d_p$. It will be understood that the use of multiplexors 90 in FIG. 12 prevents the occurrence of propagation differences in paths 72, 74 and 82 which would restrict combination of the embodiments of FIGS. 6 and 8. For example, without the use of multiplexors 90 in FIG. 12, the desired matching of paths 72, 74 and 82, 84 would be difficult, if not impossible, to achieve. It will also be understood that variations in delays 68 and 78 will not create a significant problem, since they are relatively small and their variations will track one another as a result of their being on the same IC chip.

FIGS. 10–12 have provided some specific examples of how a multiplexor 90 can be configured for use as a common logic element for performing OR and AND logic functions. It has been found that such a multiplexor 90 can also be configured to perform a variety of other logic functions, as illustrated in FIGS. 13–18 and their corresponding graphs shown in FIG. 19, Graphs C–H, respectively. FIG. 19, Graphs A and B illustrate two examples of signals X and Y on which logically functions are performed by FIGS. 13–18. Note that signals X and Y are the same, except that signals Y is delayed relative to signal X by a delay d.

Figure 13:
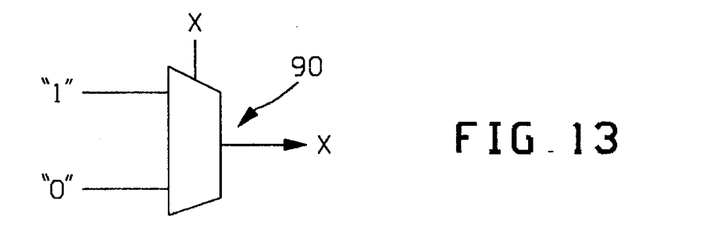
FIGS. 13–18 illustrate various configurations of a multiplexor for providing a variety of logic functions using the multiplexor as a common logic element.
Figure 14:
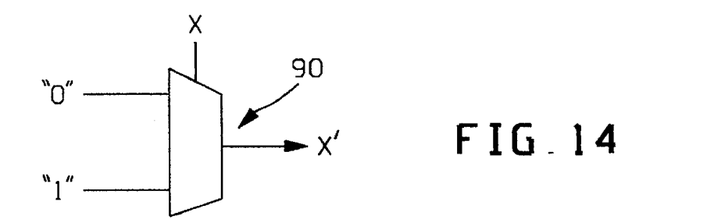
Figure 15:
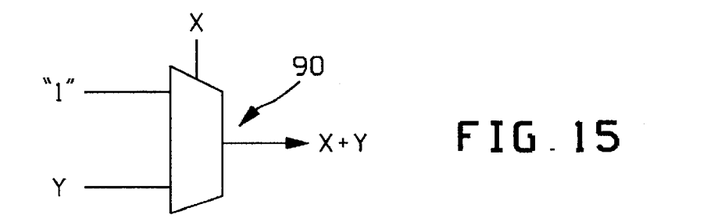
Figure 16:
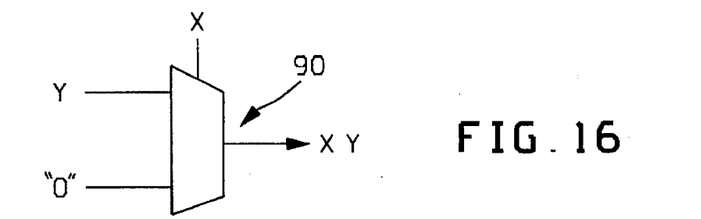
Figure 17:
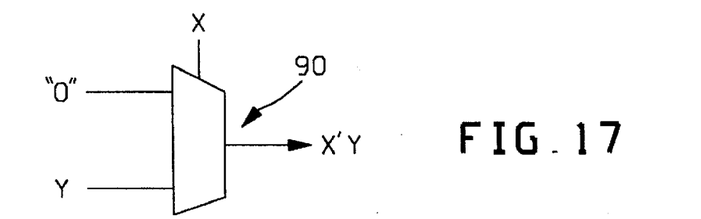
Figure 18:
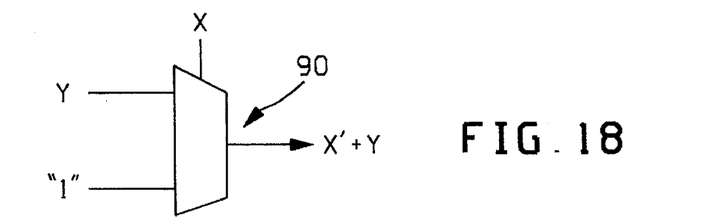
Figure 19:
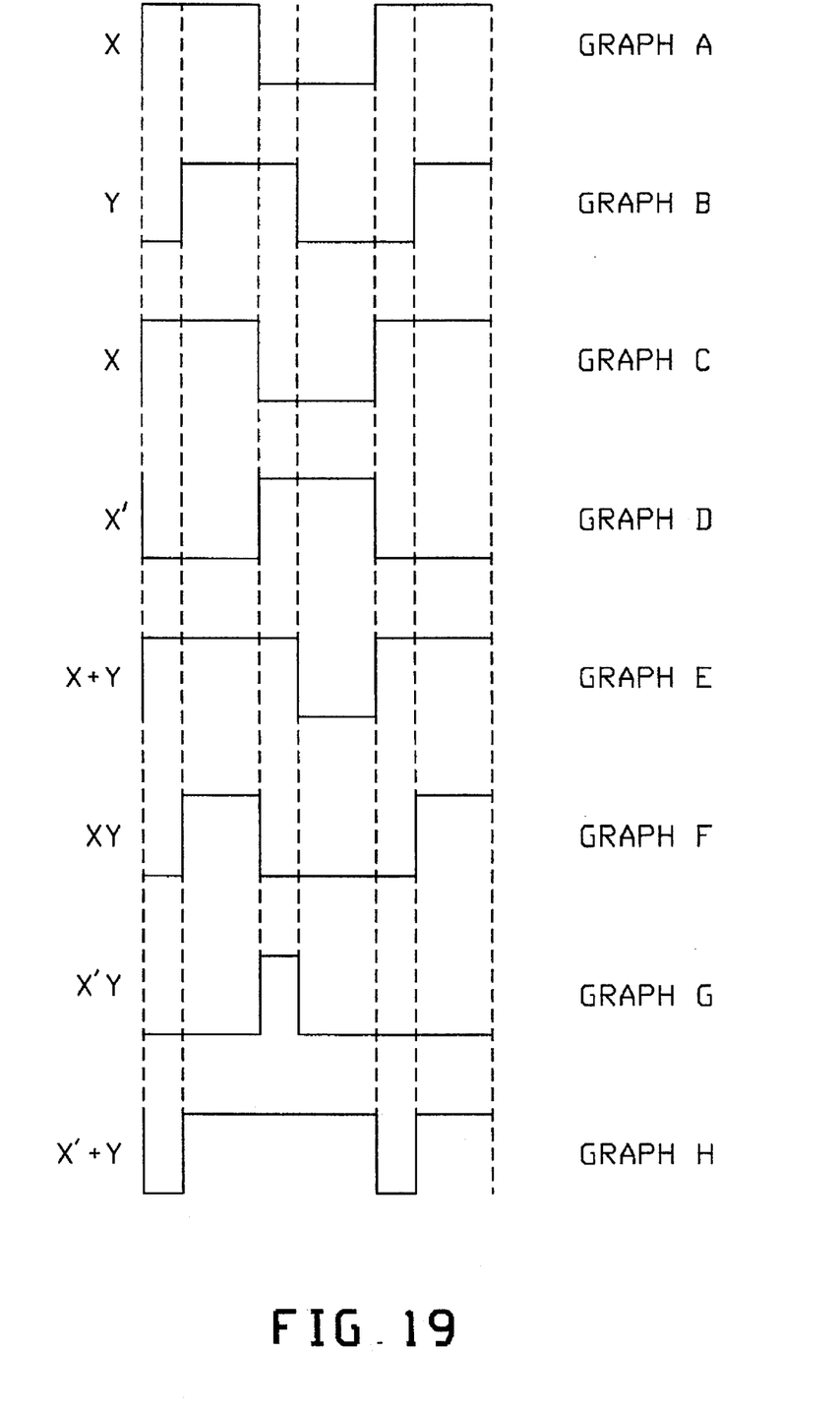
FIG. 19 is a series of graphs illustrating the performance of the multiplexor when configured as illustrated in FIGS. 13–18.

Considering FIGS. 13–18 more specifically, FIG. 13 shows a multiplexor 90 configured to pass signal X unchanged (see FIG. 19, Graph C), FIG. 14 shows a multiplexor 90 configured to invert signal X to provide an inverted output X' (see FIG. 19, Graph D), FIG. 15 shows a multiplexor 90 configured to receive signals X and Y and to provide the ORed output X+Y (see FIG. 19, Graph E), FIG. 16 shows a multiplexor 90 configured to receive signals X and Y and to provide the AND output XY (see FIG. 19, Graph F), FIG. 17 shows a multiplexor 90 configured to receive signals X and Y to provide the output XY (see FIG. 19, Graph G), and FIG. 18 shows a multiplexor 90 configured to receive signals X and Y and to provide the output XY' (see FIG. 19, Graph H).

Figure 20:
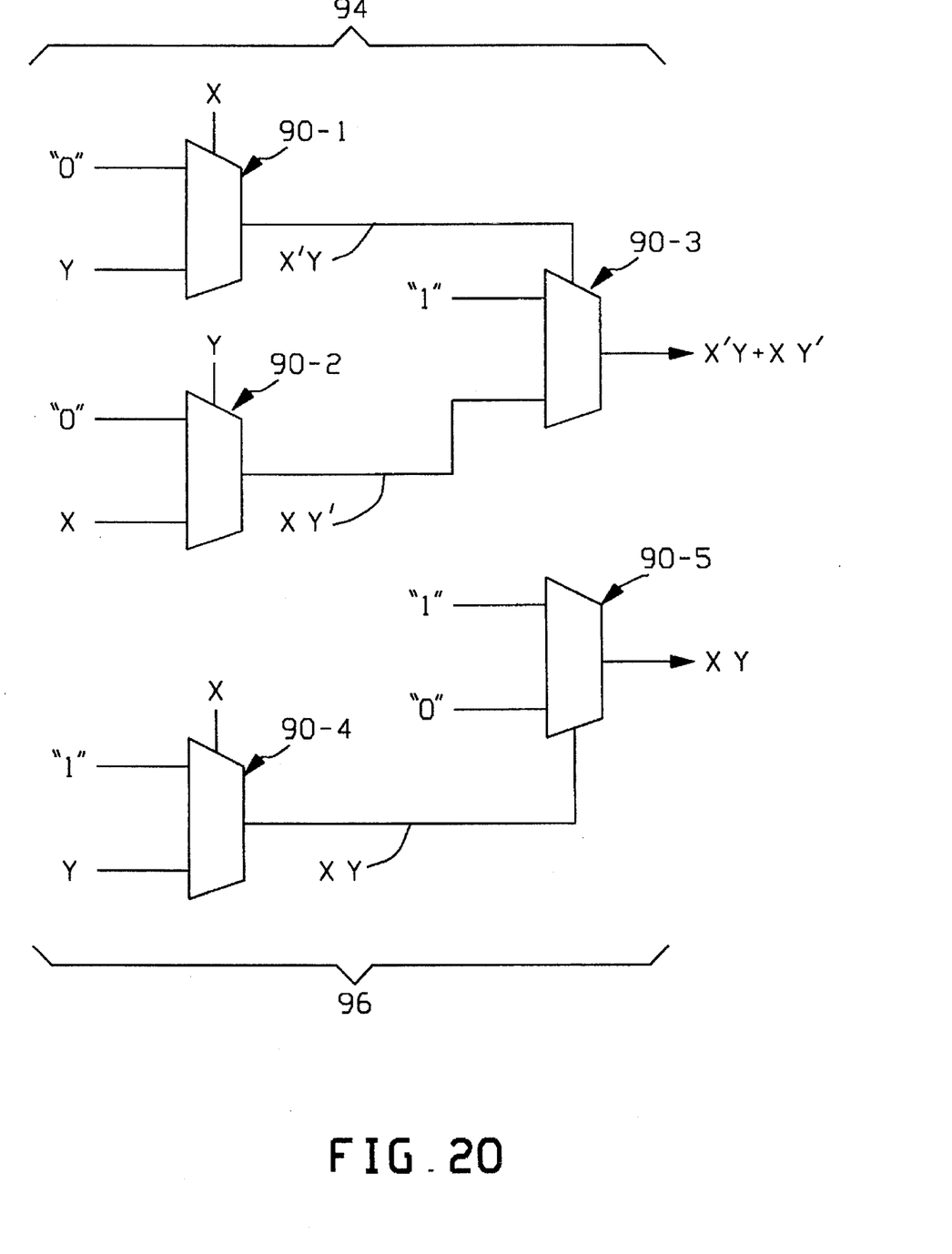
FIG. 20 is an embodiment employing particular ones of the multiplexor configurations shown in FIGS. 13–18.

It will be understood that additional and more diverse logic functions can be provided by combining particular ones of the logic functions exemplified in FIGS. 13–18. For example, FIG. 20 illustrates how path matching is readily accomplished despite the performance of two distinctly different logic functions on input signals X and Y (Graphs A and B in FIG. 19). In path 94 of FIG. 20 an EXCLUSIVE OR logical function is performed on signals X and Y using multiplexors 90-1, 90-2 and 90-3. As is well known, an EXCLUSIVE OR logical function of signals X and Y produces the resulting output X'Y+XY'. Accordingly, multiplexors 90-1 and 90-2 in FIG. 20 are configured in accordance with FIGS. 17 and 18 to produce the respective outputs X'Y and XY', and multiplexor 90-3 is configured in accordance with FIG. 15 to produce the resulting EXCLUSIVE OR output X'Y+XY'.

Since path 96 in FIG. 20, merely requires performance of an AND function on signals X and Y, multiplexor 90-4 is configured in accordance with FIG. 16 to the AND output X'Y. The additional pass-through multiplexor 90-5 in path 96 (configured in accordance with FIG. 13) is provided to receive the output of multiplexor 90-4 in order to provide two multiplexor levels in conformance with path 94, whereby the two paths 94 and 96 will thus provide accurately matched delays.

I have discovered that the use of mulitplexors for performing logic operations (as illustrated in FIGS. 10–13) permits achieving path matching to an unexpected high degree of accuracy, significantly beyond what would be expected in view of propagation variations experienced using conventional logic circuits, such as AND and OR gates. The reason is that these conventional logic circuits have been found to not only provide different propagation delays with respect to one another, but also a single logic gate, such as an AND gate, typically provides significantly different delays dependent upon the edge direction of their input signals. For example, the propagation delay introduced by a conventional AND gate or OR gate may vary by as much as two-to-one depending on input signal edge directions. These significant delay differences further increase the difficulties involved in matching paths using conventional logic circuits.

However, I have discovered that a multiplexor (such as the multiplexors 90 in FIGS. 10–12) can readily be designed to provide substantially the same propagation delay regardless of the edge direction of its input signals. For example, the IBM CMOS5L Library provides such a multiplexor for use on a CMOS IC chip.

Although the present invention has been described with respect to particular preferred embodiment, it is to be understood that various modifications in construction and arrangement are possible within the scope of the invention. Accordingly, the present invention is to be considered as including all modifications and variations coming within the scope of the invention as defined by the appended claims.

What is claimed is:

1. An integrated circuit chip comprising:

a first path containing one or more first logic elements for performing a first logic function, said first path providing a first propagation delay; and a second path containing one or more second logic elements for performing a second logic function different from said logic function, said second path providing a second propagation delay;

said first and second logic elements comprising substantially identical common multiplexor logic elements configured so as to perform said first and second logic functions and also so that each path contains the same number of levels of multiplexor logic elements;

each common multiplexor logic element being capable of performing one of a multiplicity of different logic functions in response to applied inputs while providing the same propagation delay therethrough regardless of the logic function performed thereby;

said first path including an on-chip delay which is not included in said second path, whereby said first propagation delay differs from said second propagation delay by said on-chip delay.

2. The integrated circuit chip of claim 1, including a two-input phase-locked-loop (PLL) having a system clock applied to one PLL input and an end of said first path applied to the other PLL input, and wherein the output of said PLL is applied to the other end of said first path and also to an end of said second path.

3. In an integrated circuit chip a plurality of substantially identical common multiplexor logic elements;

each common multiplexor logic element performing one of a multiplicity of different logic functions in response to binary signals applied thereto;

each common multiplexor logic element consisting of first and second multiplexor inputs, a selection multiplexor input, and a multiplexor output;

each common multiplexor logic element being constituted and arranged such that the value of a binary signal applied to said selection input selects which of binary signals applied to said first and second inputs is propagated to said multiplexor output and wherein the same multiplexor propagation delay occurs regardless of which of said first and second inputs is selected by the binary signal applied to said selection input;

a first path containing one or more of said common multiplexor logic elements for performing a first logic function, said first path providing a first propagation delay;

a second path containing one or more of said common multiplexor logic elements for performing a second logic function, said second path providing a second propagation delay;

each path containing the same number of multiplexor logic levels; and said first path including an on-chip delay which is not included in said second path, whereby said first propagation delay differs from said second propagation delay by said on-chip delay; and means for applying binary signals to said first and second paths for performing said first and second logic functions thereon.

4. The integrated circuit chip of claim 3, wherein a common multiplexor logic element provides a multiplexor output representing the logic function XY for binary signals X and Y by applying one of the X and Y binary signals to the multiplexor selection input and the other to one of the first and second multiplexor inputs while applying a "0" binary signal to the other one of the first and second multiplexor inputs.

5. The integrated circuit chip of claim 3, wherein a common multiplexor logic element provides a multiplexor output representing the logic function X+Y for binary signals X and Y by applying one of the X and Y signals to the multiplexor selection input and the other to one of the first and second multiplexor inputs while applying a "1" binary signal to the other one of the first and second multiplexor inputs.

6. The integrated circuit chip of claim 3, wherein said first path includes an on-chip delay which is not included in said second path, whereby said on-chip delay determines the propagation delay difference provided by said first and second paths.

7. In an integrated circuit chip a plurality of substantially identical common multiplexor logic elements;

each common multiplexor logic element performing one of a multiplicity of different logic functions in response to binary signals applied thereto;

each common multiplexor logic element consisting of first and second multiplexor inputs, a selection multiplexor input, and a multiplexor output;

each common multiplexor logic element being constituted and arranged such that the value of a binary signal applied to said selection input selects which of binary signals applied to said first and second inputs is propagated to said multiplexor output and wherein the same multiplexor propagation delay occurs regardless of which of said first and second inputs is selected by the binary signal applied to said selection input;

a first path containing one or more of said common multiplexor logic elements for performing a first logic function;

a second path containing one or more of said common multiplexor logic elements for performing a second logic function;

each path containing the same number of multiplexor logic levels;

a two-input phase-locked-loop (PLL) having a system clock applied to one PLL input and an end of said first path applied to the other PLL input, and wherein the output of said PLL is applied to the other end of said first path and also to an end of said second path; and means for applying binary signals to said first and second paths for performing said first and second logic functions thereon.

8. In an integrated circuit chip a plurality of substantially identical common multiplexor logic elements;

each common multiplexor logic element performing one of a multiplicity of different logic functions in response to binary signals applied thereto;

each common multiplexor logic element consisting of first and second multiplexor inputs, a selection multiplexor input, and a multiplexor output;

each common multiplexor logic element being constituted and arranged such that the value of a binary signal applied to said selection input selects which of binary signals applied to said first and second inputs is propagated to said multiplexor output and wherein the same multiplexor propagation delay occurs regardless of which of said first and second inputs is selected by the binary signal applied to said selection input;

a first path containing one or more of said common multiplexor logic elements for performing a first logic function;

a second path containing one or more of said common multiplexor logic elements for performing a second logic function;

each path containing the same number of multiplexor logic levels; and means for applying binary signals to said first and second paths for performing said first and second logic functions thereon;

wherein said first and second paths comprise three multiplexor logic elements connected to provide an EXCLUSIVE OR logic function $X'Y+XY'$ for binary signals X and Y, wherein the logic function $X'Y$ is provided by a first multiplexor logic element having binary signal X applied to the multiplexor selection input and binary signal Y applied to one of the first and second multiplexor inputs while a "0" logic level is applied to the other of the first and second multiplexor inputs wherein the logic function $XY'$ is provided by a second multiplexor logic element having binary signal Y applied to the multiplexor selection input and binary signal X applied to one of the first and second multiplexor inputs while applying a "0" logic level to the other of the first and second multiplexor inputs, and wherein the sum $X'Y+XY'$ of the multiplexor out-put of said first and second multiplexor logic elements are provided by applying the multiplexor output $X'Y$ of said first multiplexor logic element to the selection input of a third multiplexor and the multiplexor output $XY'$ of said multiplexor logic element to one of said first and second inputs of said third multiplexor logic element while applying a "1" logic level to the other of said first and second multiplexor inputs of said third multiplexor logic level, whereby the EXCLUSIVE OR function $X'Y+XY'$ is obtained from the multiplexor output of said third multiplexor logic element.

* * * * *